United States Patent [19]

Yamada

[11] Patent Number: 4,490,734
[45] Date of Patent: Dec. 25, 1984

[54] VARIABLE IMPEDANCE CIRCUIT EMPLOYING AN RIS FIELD EFFECT TRANSISTOR

[75] Inventor: Takaaki Yamada, Kanagawa, Japan

[73] Assignee: Sony Corporation, Tokyo, Japan

[21] Appl. No.: 349,454

[22] Filed: Feb. 17, 1982

Related U.S. Application Data

[63] Continuation-in-part of Ser. No. 105,497, Dec. 20, 1979, abandoned, which is a continuation of Ser. No. 719,403, Sep. 1, 1976, abandoned, which is a continuation-in-part of Ser. No. 358,168, May 7, 1973, abandoned.

[30] Foreign Application Priority Data

May 13, 1972 [JP] Japan ................................. 47-47578
Jun. 20, 1972 [JP] Japan ................................. 47-72980
Apr. 6, 1973 [JP] Japan ................................. 48-39208

[51] Int. Cl.³ ............................................. H01L 29/78
[52] U.S. Cl. ...................................... 357/23; 357/51; 357/59; 307/548; 307/577; 330/282; 330/284; 330/144
[58] Field of Search ........................... 307/547-550, 307/577, 237 F, 237 L; 330/282, 284, 144; 357/23, 51, 59

[56] References Cited

U.S. PATENT DOCUMENTS

| | | | |
|---|---|---|---|
| 3,714,522 | 1/1973 | Komiya et al. | 357/23 |
| 3,943,286 | 3/1976 | Tsurushima | 330/284 |
| 3,968,452 | 7/1976 | Sahara et al. | 357/23 MG |
| 3,999,210 | 12/1976 | Yamada | 357/23 MG |
| 4,093,874 | 6/1978 | Pollitt | 307/577 |
| 4,157,557 | 6/1979 | Sato et al. | 330/284 |

OTHER PUBLICATIONS

C. Hu et al., "A Resistive-Gated IGFET Tetrode," IEEE Trans. on Elec. Dev. vol. Ed-18 #7, Jul. 1971, pp. 418-425.

*Primary Examiner*—Joseph E. Clawson, Jr.
*Attorney, Agent, or Firm*—Hill, Van Santen, Steadman & Simpson

[57] ABSTRACT

A variable impedance circuit employing an RIS field effect transistor which greatly reduces distortion at low and high frequencies is obtained by providing means for applying voltages to the RIS field effect transistor at values determined by the following equations:

$$V_{BG} = \frac{V_D + V_S}{2} + V_{BO}$$

$$V_{GS} = V_{GO} + V_S + \left(\frac{k}{2} + \alpha_1\right)(V_S - V_D)$$

$$V_{GD} = V_{GO} + V_D + \left(\frac{k}{2} + \alpha_2\right)(V_D - V_S)$$

where $V_{BG}$ is the backgate voltage, $V_D$ is the voltage applied to the drain, $V_S$ is the voltage applied to the source, $V_{BO}$ is the DC component of the voltage applied to the substrate, K is a constant, $\alpha_1$ is a constant, $\alpha_2$ is a constant, $V_{GS}$ is the voltage applied to the gate at the end nearest the source, $V_{GD}$ is voltage applied to the gate at the end nearest the drain and $V_{GO}$ is a control voltage.

3 Claims, 13 Drawing Figures

VARIABLE IMPEDANCE CIRCUIT EMPLOYING AN RIS FIELD EFFECT TRANSISTOR

CROSS-REFERENCES TO RELATED APPLICATIONS

This application is a continuation-in-part of application Ser. No. 105,497 filed Dec. 20, 1979 which was a continuation of application Ser. No. 719,403 filed Sept. 1, 1976 which was a continuation-in-part of application Ser. No. 358,168 filed May 7, 1973 all of which prior applications are hereby incorporated by reference, all abandoned.

BACKGROUND OF THE INVENTION

1. Field of the Invention

This invention relates to a variable impedance circuit of a type suitable for use for a wide variety of circuits such as in analog computers, AGC circuits, four channel stereophonic equipment, etc. For this purpose, a conventional FET, CdS photo-conductive impedance element, etc. are known but to maintain relatively low distortion, the amplitude of input signal must be small or less than some relative low predetermined level. This means S/N ratio has a predetermined ceiling value which will be required to be increased more and more in view of Hi-Fi equipment, for example, which requires low noise level.

2. Description of the Prior Art

Semiconductor devices having a resistive layer overlying an insulating layer on a semiconductor substrate are known in the prior art. One disclosure of such a device is a field effect transistor described in U.S. Pat. No. 3,714,522. A device of this type is now referred to in the industry by the term "RIS", which stands for resistive insulating semiconductor device. In using an RIS field effect transistor in the past, there has been trouble in maintaining a relatively low distortion over a wide range of frequencies. The present invention provides a circuit employing an RIS field effect transistor which for the circuit, gives extremely good linearities and low distortion over a wide range of frequencies.

SUMMARY OF THE INVENTION

The present invention provides a novel semiconductor device and circuit having extremely low distortion over a wide range of frequencies.

It is a further object of the present invention to provide a novel circuit comprising a field effect transistor having a substrate, a source, a drain, and a gate with means for applying electric potentials $V_S$, $V_D$ and $V_{BG}$ to the source, drain and substrate respectively, and with gate electrodes for applying potentials $V_{GS}$ and $V_{GD}$ to gate portions corresponding to the source and drain, respectively, the values of $V_S$, $V_D$, $V_{GS}$, $V_{GD}$ and $V_{BG}$ being chosen to satisfy the following equations:

$$V_{GS} = V_{GO} + V_S + \left(\frac{k}{2} + \alpha_1\right)(V_S - V_D)$$

$$V_{GD} = V_{GO} + V_D + \left(\frac{k}{2} + \alpha_2\right)(V_D - V_S)$$

$$V_{BG} = V_{BO} + \frac{V_S + V_D}{2}$$

where $V_{BG}$ is the backgate voltage, $V_D$ is the voltage applied to the drain, $V_S$ is the voltage applied to the source, $V_{BO}$ is the DC component of the voltage applied to the substrate, K is a constant, $\alpha_1$ is a constant, $\alpha_2$ is a constant, $V_{GS}$ is the voltage applied to the gate at the end nearest the source, and $V_{GD}$ is the voltage applied to the gate at the end nearest the drain. As shown in FIG. 7, $V_{GO}$ is the output of a control voltage source 43 which can be controlled by the control knob 18. The voltage $V_{GO}$ is also illustrated in FIG. 7 where it is shown as a voltage difference.

It is a still further object of the present invention to connect one end of the resistive path of the aforesaid transistor through a condenser to the source, or through a condenser to the drain, or to both source and drain through separate condensers.

DESCRIPTION OF THE PREFERRED EMBODIMENTS

An embodiment of the field effect transistor, which forms the main part of the variable impedance circuit according to the present invention, will not be described in detail with reference to FIG. 1.

Figure 1:
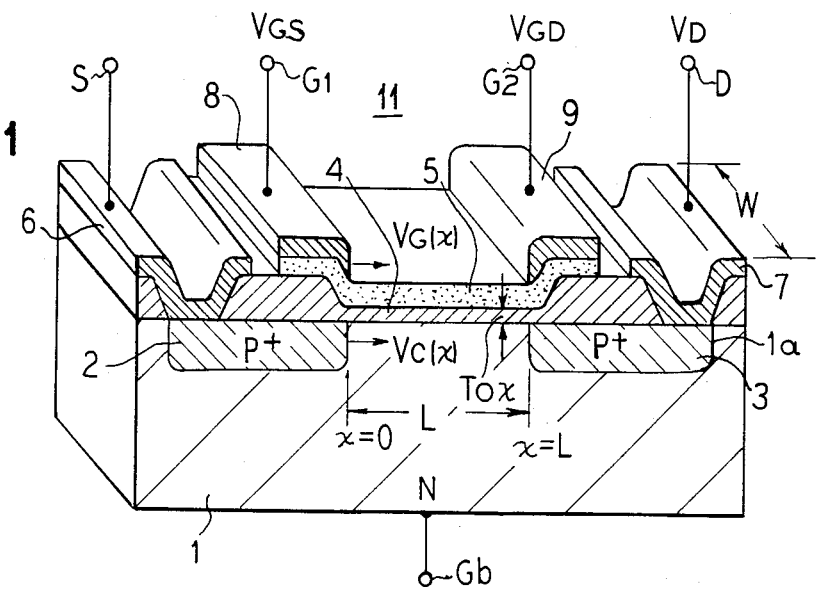
FIG. 1 is a sectional isometric view which diagrammatically illustrates an RIS device according to the present invention.

In FIG. 1, reference numeral 11 generally shows the field effect transistor. The field effect transistor 11 consists of a semiconductor substrate 1 of relatively low impurity concentration such, for example, as a silicon substrate of an N-type conductivity, which forms a semiconductor base region of a first conductivity type, and first and second regions or source and drain regions 2 and 3 of a second conductivity type, for example, a P+-type conductivity with a predetermined distance or length (channel length) L therebetween. The regions 2 and 3 are formed in the silicon substrate 1 and faced to its major surface 1a. Between the first and second regions 2 and 3, there is formed a gate-insulating layer made, for example, of silicon dioxide $SiO_2$ on the major surface 1a, and then a gate-resistive layer 5 made, for example, of polycrystalline silicon of high resistance, is formed on the insulating layer 4. A source electrode 6 and a drain electrode 7 are attached to the regions 2 and 3 in ohmic contact therewith, respectively, and first and second gate electrodes 8 and 9 are attached to the gate-resistive layer 5 above the regions 2 and 3 in such a manner that the opposing edges of the gate electrodes 8 and 9 precisely coincide with the opposing edges of the regions 2 and 3, respectively. Thereafter, a source terminal S, a drain terminal D, a first gate terminal $G_1$, a second gate terminal $G_2$ and a backgate terminal $G_b$ are connected to the electrodes 6, 7, 8 and 9 and the back of the substrate 1, respectively.

(I) With the field effect transistor 11, mentioned above, if it is assumed that the resistivity of the channel at a point spaced from the first region 2 by a distance x is taken as $\rho_s(x)$ and the gate voltage applied to the resistive layer 5 at the point x as $V_G(x)$, the following equations (1), (2) and (3) are obtained in DC current (or low frequency) and with $V_S=0$.

$$\rho_s(x) = \frac{T_{ox}}{\epsilon_{ox}\mu}\left[V_G(x) - V_C(x) - V_{th} - k'\sqrt{-V_{BG}+2\phi_F} + k'\sqrt{V_C(x) - V_{BG} + 2\phi_F}\right]^{-1} \quad (1)$$

where $$k' = \frac{T_{ox}}{\epsilon_{ox}}\sqrt{2q\,\epsilon_s N},$$

$$V_G(x) = \frac{x}{L}V_D + V_{GO} \quad (2)$$

$$\frac{I_D}{W}\rho_s(x) = \frac{dV_C(x)}{dx} \quad (3)$$

where $T_{ox}$ and $\epsilon_{ox}$ are the thickness and dielectric constant of the insulating layer 4, $V_C(x)$ the channel potential at the point x, $V_{th}$ the threshold voltage, $V_{BG}$ the voltage applied to the substrate 1 through the backgate terminal $G_b$, $\phi_F$ the Fermi level measured from the middle of the forbidden band, q the charge of the carrier, $\epsilon_s$ and N the dielectric constant and the carrier concentration of the substrate I, $I_D$ the drain current, and W the width of the channel, respectively.

From the above equations, the following equation (4) can be derived.

$$I_D = \frac{\beta(V_G(L) - V_G(O))}{1 + k}\left[V_G(O) - V_{th} + \{V_G(L) - V_G(O) - (1+k)V_D\} \times \left\{\exp\left(\frac{\beta V_D(V_G(L) - V_G(O))}{I_D}\right) - 1\right\}^{-1}\right] \quad (4)$$

where $$k = \frac{T_{ox}}{2\epsilon_{ox}}\sqrt{2q\,\epsilon_s N}\cdot\frac{1}{\sqrt{-V_{BO}+2\phi_F}},$$

$V_D$ is the drain potential, and $V_{BO}$ the DC component of $V_{BG}$.

In order to improve the distortion factor or the linearity of the transistor mentioned above, it is necessary that the equation (4) be a first order function of the drain potential $V_D$. To this end, the following equations (5) and (6) are sufficient.

$$V_G(L) - V_G(O) = (1 + k)V_D \quad (5)$$
$$V_G(O) - V_{th} = \text{constant} \quad (6)$$

where $V_{th}$ is $V_{th}(V_{BG})$.

If the voltage $V_{BG}$ of the substrate 1 is taken as follows, $$V_{BG} = V_{BO} + V_B(V_D) \quad (7)$$

$V_{th}$ can be expressed as follows:

$$V_{th} \approx V_{the} - kV_B \quad (8)$$

where $V_{the} = V_{th}(V_{BO})$.

Accordingly, the following equations (9) and (10) are obtained from the equations (5) and (6) with the assumption that the DC component $V_{GO}$ of the gate potential, which may be the control voltage or control the resistance, is constant.

$$V_G(O) = V_{GO} - kV_B(V_D) \quad (9)$$
$$V_G(L) = V_{GO} + (1 + k)V_D - kV_B(V_D) \quad (10)$$

If the source potential $V_S$ is taken into account, the following equations (11) and (12) are obtained.

$$V_G(O) = V_{GO} + (1 + k)V_S - kV_B(V_D, V_S) \quad (11)$$
$$V_G(L) = V_{GO} + (1 + k)V_D - kV_B(V_D, V_S) \quad (12)$$

The above equations (11) and (12) are a general equation in low frequency which will provide the condition to make the distortion factor minimum.

(II) Next, the case of high frequency will be considered. In high frequency, due to the gate-channel capacity and the high resistance of the gate, the gate and the channel are coupled in AC and $V_G(x) - V_C(x) + V_{GO}$ is established. Accordingly, the following fundamental equation (1') is obtained for high frequency.

$$\rho_s(x) = \frac{T_{ox}}{\epsilon_{ox}\mu}\left[V_{GO} - V_{th} - k'\sqrt{-V_{BG}+2\phi_F} + k'\sqrt{V_C(x) - V_{BG} + 2\phi_F}\right]^{-1} \quad (1')$$

$$\frac{I_D}{W}\rho_s(x) = \frac{dV_C(x)}{dx}$$

$$V_C(O) = 0$$
$$V_C(L) = V_D$$

From this equation the following equation (13) is obtained.

$$I_D = \beta \left( V_{GO} - V_{th}(V_{BO}) + k'\beta \sqrt{-V_{BO} + 2\phi_F} \right) V_D + \tag{13}$$

$$\frac{2}{3} k'\beta(-V_{BO} + 2\phi_F - V_B(V_D))^{\frac{3}{2}} -$$

$$\frac{2}{3} k'\beta(-V_{BO} + 2\phi_F + V_D - V_B(V_D))^{\frac{3}{2}}$$

If the equation (13) is expanded in a Taylor's series with the factor $(-V_{BO} + 2\phi_F)$ as center, the following equation (14) is obtained.

$$I_D = \beta \left( V_{GO} - V_{th}(V_{BO}) + k'\beta \sqrt{-V_{BO} + 2\phi_F} \right) V_D + \tag{14}$$

$$\frac{k'\beta}{2} \cdot \frac{\left( V_B(V_D) - \frac{V_D}{2} \right) V_D}{\sqrt{-V_{BO} + 2\phi_F}} +$$

$$\frac{k'\beta}{24} \cdot (-V_{BO} + 2\phi_F)^{-\frac{3}{2}} \left\{ 3 \left( V_B(V_D) - \frac{V_D}{2} \right)^2 - \frac{V_D^2}{4} \right\} V_D +$$

$$\ldots + \frac{k'\beta(2n-7)!}{(-2)^{n-1}(n-4)!} (V_{BO} + 2\phi_F)^{\frac{-2n-3}{2}} \{(-V_B(V_D))^n - (V_D - V_B(V_D))^n\} +$$

$$\ldots = a_1 V_D + a_2 V_D^2 + a_3 V_D^3 + \ldots + a_n V_D^n + \ldots$$

In the above equation (14), the second term and the other terms following thereto are non-linear terms so that the minimum $V_B(V_D)$ reduces the distortion factor to a minimum. As will be apparent from the equation (14), the second term $V_B(V_D) = V_D/2$ becomes zero and its third term $V_B(V_D) = V_D/2$ becomes minimum. As to the nth term, it is $V_B(V_D) - V_D/2$ which becomes zero when n is an even number, but it is $V_B(V_D) = V_D/2$ which becomes minimum when n is an odd number. In other words, the following equation (15) can make the second terms and those following thereto of the equation (14) minimum.

$$V_B(V_D) = \frac{V_D}{2} \tag{15}$$

The ratio of the equation (15) with the equation $V_B(V_D) = 0$ is expressed as follows:

$$\frac{a_n \left( V_B = \frac{V_D}{2} \right)}{a_n(V_B = 0)} = \frac{1 - (-1)^n}{2^n}$$

The ratio becomes zero when n is an even number, but $2^{1-n}$ when n is an odd number.

If the source potential $V_S$ is also considered, the equation (15) becomes as follows:

$$V_B(V_D, V_S) = \frac{V_D - V_S}{2} \tag{16}$$

This equation (16) is the condition necessary for the distortion constant to become minimum in high frequency.

(III) Accordingly, in order to make the distortion minimum at both low and high frequencies, it is sufficient that the equations (11), (12) and (16) be satisfied at the same time. As a result, it is sufficient that in the following equations (17), (18) and (19), $V_G(O)$ and $V_G(L)$ or voltages applied to the first and second gate electrodes 8 and 9 are set, and $V_{BG}$ or voltage applied to the back gate terminal $G_b$ is set to be $$V_G(O) = V_{GO} + V_S + \frac{k}{2}(V_S - V_D) \tag{17}$$

$$V_G(L) = V_{GO} + V_D + \frac{k}{2}(V_D - V_S) \tag{18}$$

$$V_{BG} = \frac{V_D + V_S}{2} + V_{BO} \tag{19}$$

In fact, there is a shift of patterns of the first and second gate electrodes 8 and 9 and so on, and there is a contact resistance of the electrodes 8 and 9 and so on. Accordingly, if these facts are taken into account, it is required that the equations (18) and (19) be corrected and hence $V_G(O)$ and $V_G(L)$ or voltages $V_{GS}$ and $V_{GD}$ applied to the first and second gate electrodes 8 and 9 become as follows:

$$V_{GS} = V_{GO} + V_S + \left( \frac{k}{2} + \alpha_1 \right)(V_S - V_D) \tag{17'}$$

$$V_{GD} = V_{GO} + V_D + \left( \frac{k}{2} + \alpha_2 \right)(V_D - V_S) \tag{18'}$$

where $\alpha_1$ and $\alpha_2$ are correction factors for correcting the above pattern shift and contact resistance.

As described above, the field effect transistor 11 shown in FIG. 1 is supplied with the above potentials, that is, the substrate 1 or the back gate terminal $G_b$ is supplied with the potential determined by the equation (19), and the first and second gate terminals $G_1$ and $G_2$ are supplied with the potentials determined by the equations (17') and (18'), respectively, so that the transistor 11 shows good linearity over a wide frequency or low and high frequencies.

Figure 2:
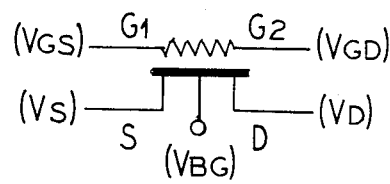
FIG. 2 is a symbolized diagram of the transistor shown in FIG. 1.

FIG. 2 shows the field effect transistor 11 in symbolized form.

Figure 3:
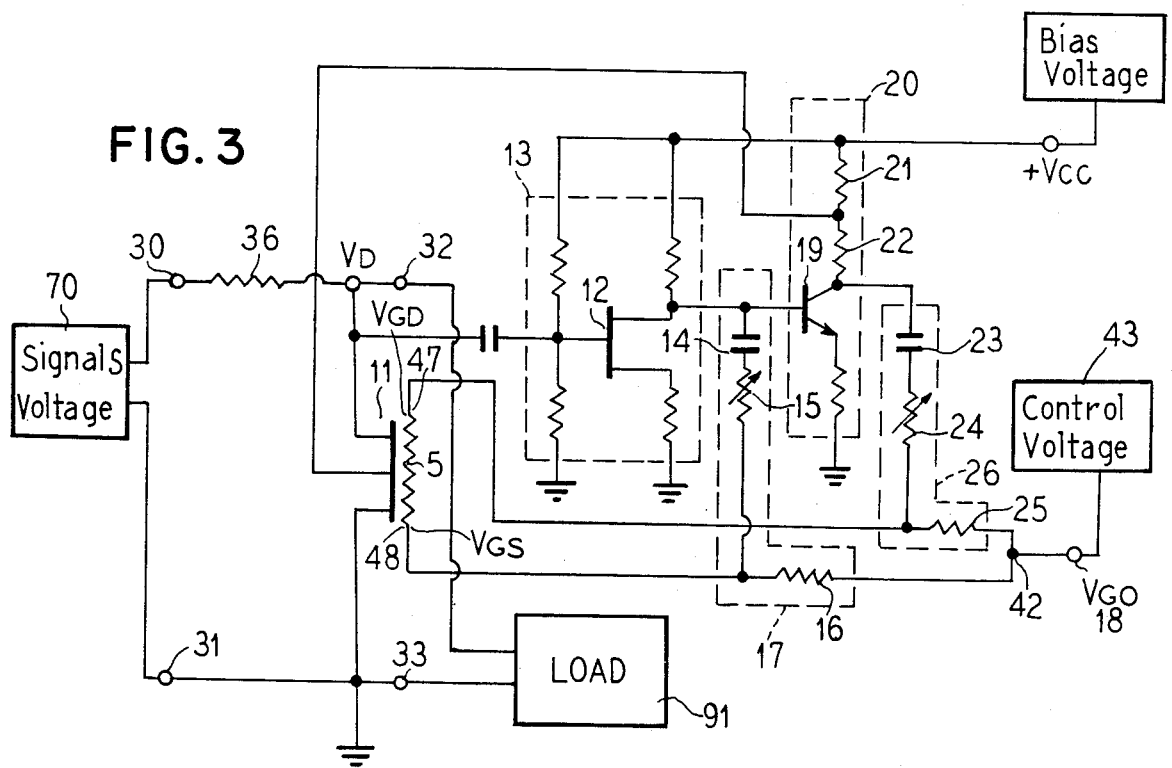
FIG. 3 is a circuit diagram of a preferred embodiment of a circuit according to the present invention for applying suitable voltages to the transistor shown in FIG. 1.

With reference to FIG. 3, and example of the circuit according to the invention, which applies the voltages based upon the equations (17'), (18') and (19) to the respective terminals $G_1$, $G_2$ and $G_b$, will be now described. In this example, the field effect transistor 11 is used with its source being grounded. A phase inverter circuit 13 including a field effect transistor 12 is provided at the drain side of the transistor 11 of the invention. The phase-inverted output of the phase inverter circuit 13 is supplied to an adding circuit 17 consisting of a capacitor 14, a variable resistor 15 and a resistor 16 and which adds to the control voltage $V_{GO}$ supplied from a terminal 18. Thereafter, the added signal is applied to the first gate electrode 8 (FIG. 1) i.e., the gate electrode 48 at the source side of the transistor 11. In this case, the resistance value of the variable resistor 15 in the adding circuit 17 is set in accordance with the correction factor $\alpha_1$ so as to apply to the gate electrode at the source side 48 of the transistor 11 the added voltage of $-V_D$ multiplied by $(k/2+\alpha_1)$ to $V_{GO}$. A circuit 20, which consists of, for example, a transistor 19 and achieves phase inversion and amplification, is provided at the following stage of the phase inverter circuit 13. The output from the circuit 20, which is divided by resistors 21 and 22 in the circuit 20, is applied to the substrate of the transistor 11. Further, the output of the circuit 20 is added to the control voltage $V_{GO}$ from the terminal 18 by an adding circuit 26 consisting of a capacitor 23, a variable resistor 24 and a resistor 25. The thus added signal is then applied to the second gate electrode 47 or the gate electrode at the drain side of the transistor 11. In this case, the resistance value of the variable resistor 24 is set in accordance with the correction factor $\alpha_2$ to add $V_D$ multiplied by $(k/2+\alpha_2)$ to $V_{GO}$, and the thus added signal is applied to the gate electrode 47 at the drain side of the transistor 11.

Figure 4:
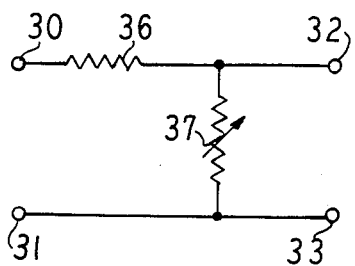
FIG. 4 illustrates a variable attenuation circuit in which the variable attenuator may be the novel field effect transistor and circuit of the invention.
Figure 5:
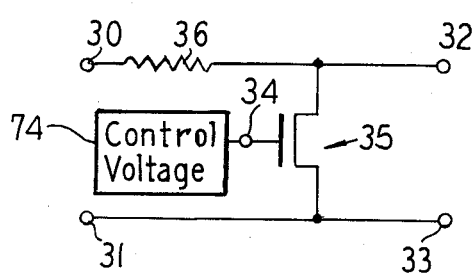
FIG. 5 illustrates the variable impedance circuit with the field effect transistor installed therein.

In the illustrated embodiment of the invention, the source electrode and the drain electrode are arranged to be connected to a main signal source 70 through a series resistor 36 which with the transistor of the invention forms the variable impedance circuit. This can be understood as follows. FIG. 4 illustrates the input terminals 30 and 31. Input terminal 30 is connected to output terminal 32 through resistor 36 and input terminal 31 is connected to output terminal 33. Variable resistor 37 is connected between output terminals 32 and 33. This is a classical variable impedance circuit. FIG. 5 illustrates a conventional variable impedance circuit with the FET 35 comprising the variable resistor. The FET 35 has a control terminal 34 to which a control voltage 74 can be connected.

Figure 6:
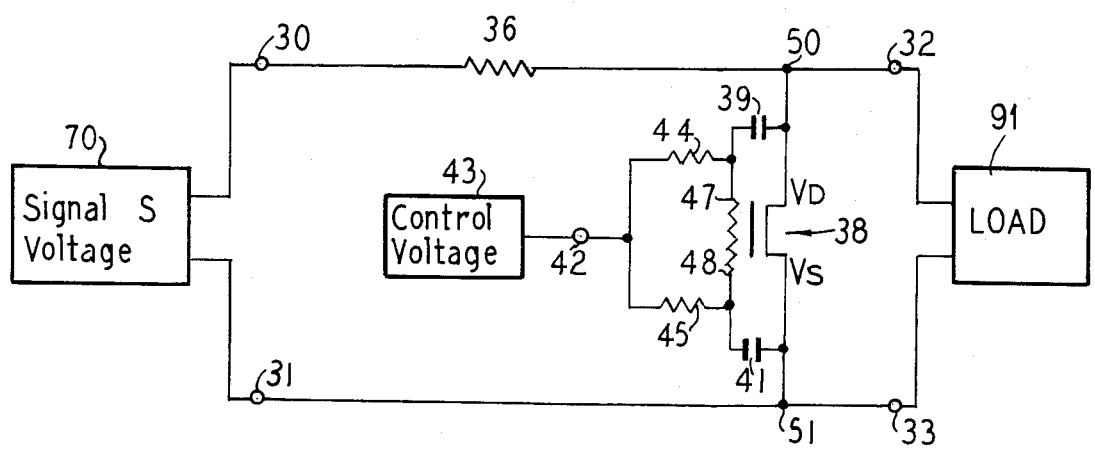
FIG. 6 illustrates the variable impedance circuit with the field effect transistor of the invention.

In the present invention, a resistive gate FET 38 replaces, as shown in FIG. 6, the conventional FET in this invention to obtain a linear current-voltage characteristic. To have a uniform resistivity throughout its channel for any $V_D$ and $V_S$, which is the condition of linearity, it is necessary that the voltage between the gate and the channel be constant ($V_{GO}$), which is mathematically stated as:

$$V_{GS} = V_S + V_{GO} \quad (17'')$$
$$V_{GD} = V_D + V_{GO} \quad (18'')$$

where $(k/2+\alpha_1)$ and $(k/2+\alpha_2)$ are negligible.

The above condition is simply realized by applying gate terminals with AC component of the signal as shown in FIG. 4, which is an operating circuit.

In FIG. 6 the terminals 30 and 31 may be connected to an AC signal 70 and terminals 32 and 33 may be connected to a load 91. Terminal 50 is connected to the drain $V_D$ of transistor 38 and the source $V_S$ is connected to terminal 51 which is connected to the input terminal 31 and output terminal 33. The drain end 47 of the resistive gate is connected to a capacitor 39 which has its other side connected to terminal 50 so that a portion of the AC component of the signal at terminal 50 is coupled to the drain end 47 of the resistive gate. A capacitor 41 is connected between the source end 48 of the resistive gate and terminal 51 for the same purpose. A control voltage 43 is connected to terminal 42. A resistor 44 is connected between terminal 42 and drain end 47 of the resistive gate. A resistor 45 is connected between terminal 42 and the source end 48 of the resistive gate.

The circuit of FIG. 6 has been operated successfully.

Figure 7:
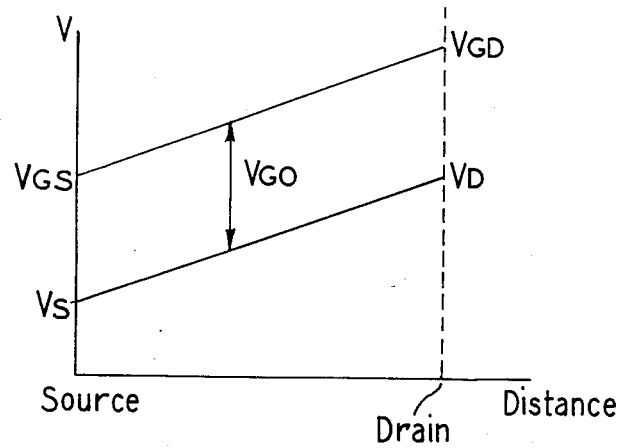
FIG. 7 is a plot illustrating the voltage characteristic of the invention.

FIG. 7 is a plot of the operating characteristics of the circuit of FIG. 6. The voltage on the resistive gate between terminals 47 and 48 will vary with the voltages on the source and drain.

As shown in FIG. 3, the control voltage 43 with knob 81 for varying its output voltage is connected to terminal 18 which corresponds to terminal 42 in FIG. 6. The circuit of FIG. 3 is a slightly more sophisticated version of the circuit of FIGS. 5 and 6, but it still results in a linear characteristic field effect transistor which operates as a variable impedance.

The gate resistive layer 5 may have a resistance of 10K ohms to 30 gigi ohms per square.

The substrate 1, by way of example, is of a relatively low impurity density. Particularly in case of an integrated circuit in which normally a further substrate is provided under the substrate 1 having a different conductive type thereto is provided, the density of the substrate 1 is such as to provide a resistivity of about 50 ohm-cm or more to avoid or reduce the effect of the IC substrate and further the densities of the regions 2 and 3 are respectively about $10^{19}$ atoms/cm$^3$. The length L of the channel is about 20 micron, its width is about $300\mu$ and the thickness of the insulating layer 4, Tox, in case of SiO$_2$, is about 1200 Å (angstrom). The layer 5 of polycrystalline silicon is about $1\mu$ in thickness. The surface resistivity thereof is in the range of 10 kilo-ohm/square–30 giga-ohm/square where the resistivity is very high of the layer 5, special contacts must be used for the electrodes 8 and 9. In such construction, a potential V(x) at point X in the channel area spaced some distance from the source region 2, a gate voltage $V_G(X)$ at the corresponding point in the gate and a threshold voltage of this device Vth are respectively defined as:

$$V_G(X) - V(X) > Vth$$

where variation of Vth due to the voltage of the substrate 1 is very small or negligible, then the number of charge carriers N at the point X per unit area will be given as follows:

$$N = \frac{Co}{q} \cdot \{V_G(X) - V(X) - Vth\}/\text{cm}$$

where $Co = \epsilon ox/Tox$
 $\epsilon ox$: dielectric constant of the insulating layer 4,
 q: electron charges of the carrier.

On the other hand, resistance R(X) in the channel between the end of the region 2 and the point X will be $$dR(X) = \rho_S(X) \frac{dX}{W}$$

$$\rho_S(X) = \frac{1}{Nq\mu}$$

where $_S(X)$ is the surface resistivity of the channel, and $\mu$ is the mobility of the charge carriers:
As a result, $$dR(X) = \frac{1}{C_0\mu \{V_G(X) - V(X) - V_{th}\}} \cdot \frac{dX}{W}$$

Accordingly, the channel current I will be $$I\, dR(X) = dV(X) \quad (1)$$

$$= \frac{I}{W\mu C_0 \{V_G(X) - V(X) - V_{th}\}} dX$$

If $$V_G(X) - V(X) = V_{GO} = \text{constant} \quad (2)$$

is supposed: and the equation 1 integrated from x=0 to x=L (channel length);

$$\int_0^V \{V_G(X) - V(X) - V_{th}\}\, dV(X) = \frac{L}{W\mu C_0} I$$

That is, $$I = \beta (V_{GO} - V_{th}) V \quad (19)$$

will be obtained; where $$V = V(L),\ \beta = \frac{W\mu C_0}{L}.$$

Finally, it should be noted that the equation (19) is a linear function with the condition (2). In case the potentials of source 2 and drain 3 are $V_S$ and $V_D$ respectively, the 1st gate electrode 8 should be $V_S+V_{GO}$ and the 2nd gate electrode 9 should be $V_D+V_{GO}$ as shown in FIG. 2 and the equation (19) can be satisfied.

This means, a first linear equation (I=RV) in the channel between source 2 and drain 3 can be obtained and the channel resistance R(X) will be on a linear line. The resistance or impedance can be controlled only by the gate voltage $V_{GO}$. With the invention, a variable impedance circuit can be easily constructed.

Figure 8:
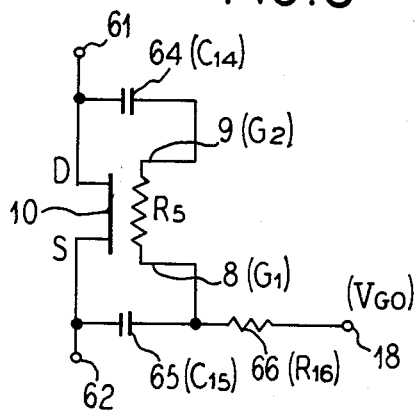
FIG. 8 is a circuit diagram for explaining the invention.

As shown in FIG. 8, the drain is connected to a terminal 61 which is also connected to the 2nd gate electrode 9 through a condenser 64. Further, the source is connected to a terminal 62 which is also connected to the 1st gate electrode 8 through a condenser 65. A control terminal 18 is connected to the 1st gate electrode through a resistor 66 to which a control signal is applied. In such a case, if desired, a backgate voltage (biasing in reverse) will be applied to the substrate 1. In case of P-channel enhancement type, a positive backgate voltage will be applied and a control voltage $V_{GO}$ will be negative.

An input signal of frequency $f_1$, the control signal $V_{GO}$ of frequency $f_2$, Capacity $C_{14}$ of the condenser 64, capacity $C_{15}$ of the condenser 65, resistance $R_{16}$ of the resistor 66 and resistance $R_5$ between the 1st and the 2nd gate electrodes (resistance of the resistive layer 5) are respectively defined, where $$f_1 >> f_2$$

where $f_2$ is usual d.c. or low frequency $$R_5 \text{ and } R_{16} >> \frac{1}{2\pi f_1 C_{15}}$$

$$R_5 >> \frac{1}{2\pi f_1 C_{14}}$$

are also determined.

Then, the reactances of the condensers 64 and 65 are small from the standpoint of $f_1$ of the input signal, on the other hand, are large from the standpoint of $f_2$ of $V_{GO}$, the gate potentials of the 1st electrode and the 2nd electrode should be respectively $V_S+V_{GO}$ and $V_D+V_{GO}$. Therefore, in accordance with the equation 19, a linear impedance characteristic between the terminals 61 and 62 is obtained, which can be adjusted by the control signal $V_{GO}$ applied at the terminal 18. The circuit arrangement shown in FIG. 8 is very simple and thus will be suited for an AGC circuit because the necessary condition $f_1>>f_2$ can be satisfied therein.

Figure 9:
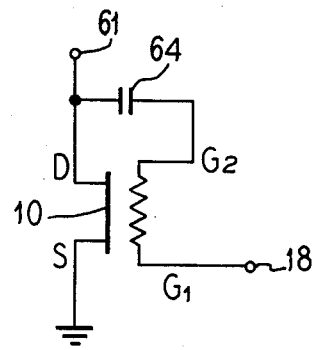
FIG. 9 is a circuit diagram for explaining the invention.

FIG. 9 shows a source grounded circuit where the condenser 65 in FIG. 8 will be eliminated therefrom because $V_S=0$. If an internal capacitor 64 is used, then electrode 9 may be eliminated.

Figure 10:
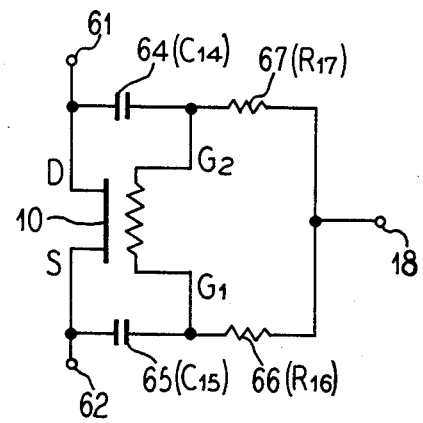
FIG. 10 is a circuit diagram for explaining the invention.

FIG. 10 shows a bridge circuit using a resistor 67 ($R_{17}$) where $C_{14}.R_{17}=C_{15}.R_{16}$ are chosen. Accordingly, the potential difference between the gate electrodes $G_1$ and $G_2$ will be nearly zero and the same control voltages $V_{GO}$ are equally applied to both the terminals $G_1$ and $G_2$ from the terminal 18. According to this example, $f_1>5f_2$ instead of $f_1>>f_2$ will be usable.

Figure 11:
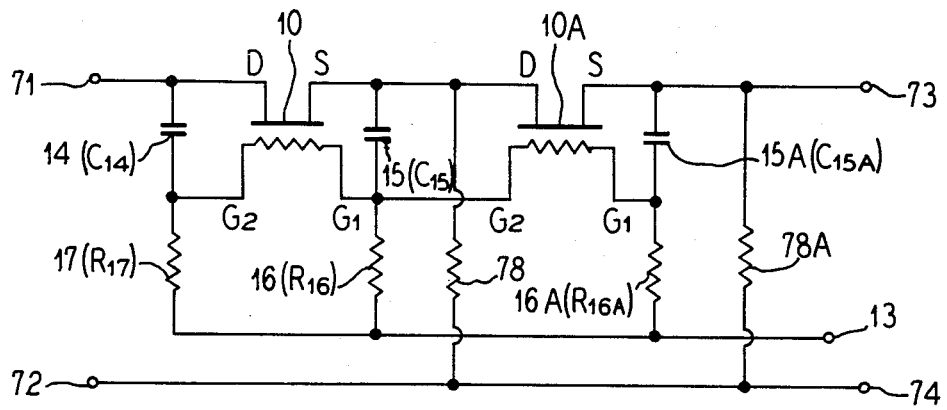
FIG. 11 illustrates two field effect transistors connected in the circuit.

FIG. 11 shows a T-type attenuator using 2 sets of the circuit of FIG. 10, where 71 and 72 are input terminals; 73 74 are output terminals; 10A is a similar device to 10; 78, 78A are attenuation or shunt resistors; 15A and 16A correspond to the condenser 65 and the resistor 66 where $C_{14}.R_{17}=C_{15}.R_{16}=C_{15A}.R_{16A}$ are chosen. About 80 db or more attenuation can be obtained thereby without distortion.

Figure 12:
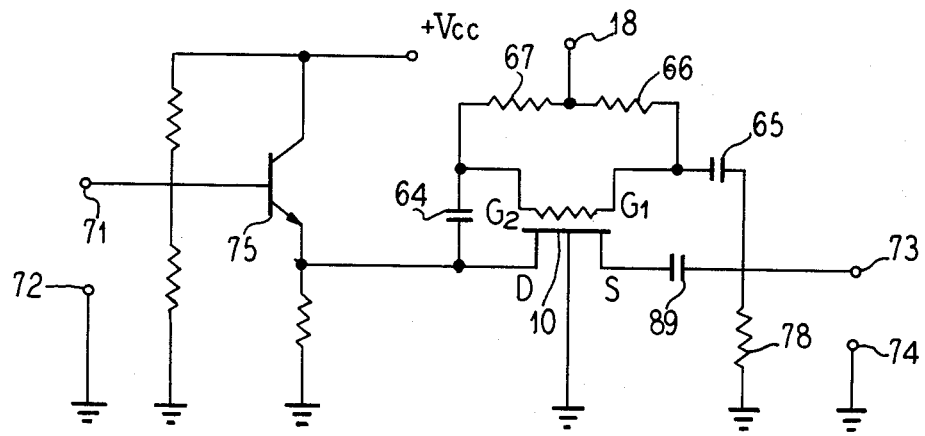
FIG. 12 illustrates a field transistor connected in the series signal path.
Figure 13:
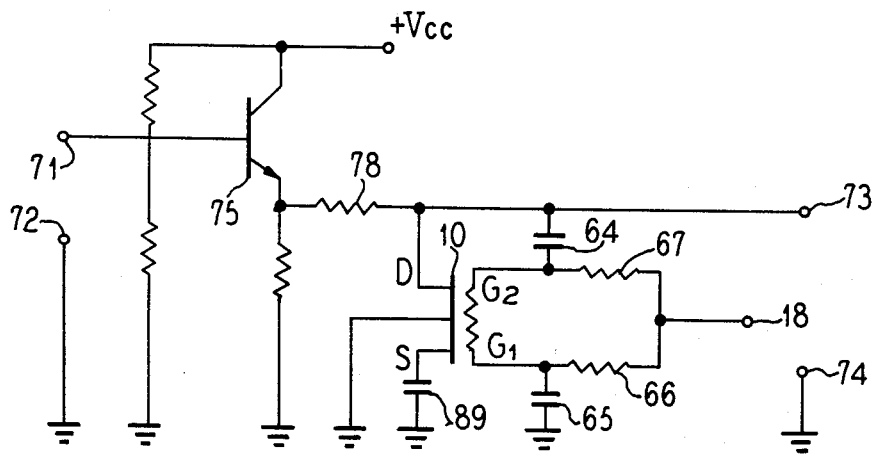
FIG. 13 illustrates a field effect transistor connected in the shunt path.

FIGS. 12 and 13 show a signal level controlling circuit where a backgate voltage (ground potential) is applied to the FET 10 and accordingly noise will not be introduced and the S/N ratio will be improved. The FET 10 in these example is of an N-channel depletion type and $V_{GO}$ is positive.

In FIG. 12 the FET 10 is inserted in series in the signal path, while in FIG. 13 it is in shunted relation. A condenser 65 (or ground) and source of the FET 10 is for bypassing signals.

According to these examples, a level of the signal transferred from an emitter-follower transistor 75 can be suitably controlled without receiving any distortion over a wide range. The circuit itself is very simple and only by varying the DC control voltage a high freq. signal applied to the terminals 71 and 72 can be adjusted. 73 and 74 are output terminals.

It is particularly desirable in the field effect transistor illustrated in FIG. 1, that the portions of the resistive layer 5 which lie immediately below the gate electrodes 8 and 9 be of much lower resistance than the portion of 5 which is above the channel. This is important so that there is a good ohmic contact with these portions of layer 5 below gate electrodes 8 and 9. Since the resistive layer 5 is preferably polycrystalline of low or negligible doping, it is easy to highly dope the portions immediately below the electrodes 8 and 9.

It may be apparent that many modifications and variations could be effected by those skilled in the art without departing from the spirit and scope of the novel concepts of the present invention.

I claim as my invention:

1. A variable impedance circuit comprising a field effect transistor formed from a substrate in which a source and a drain region are formed, an insulating layer formed on said substrate between said source and drain, a resistive gate layer formed on said insulating layer between said source and drain, a first gate electrode connected to a first end of said resistive gate layer which is near said source, a second gate electrode connected to a second end of said resistive gate layer which is near said drain, a back gate electrode connected to said substrate of said field effect transistor, a voltage source connected to said back gate electrode, a first phase inverter connected to said drain, a first adder circuit including a first variable resistor connected to said first phase inverter, a control voltage source connected to said first adder and the output of said first adder connected to said second gate electrode, a second phase inverter and amplifier circuit connected to the output of said first phase inverter circuit, a second adder circuit including a second variable resistor connected to said second phase inverter circuit, the output of said second adder and said control voltage source connected to said first gate electrode, a load connected across said source and drain, and an input voltage connected across said source and drain.

2. A variable impedance circuit according to claim 1 including a third resistor connected between said input voltage and said drain electrode.

3. A variable impedance circuit according to claim 2 wherein a portion of the output voltage of the second phase inverter is applied to the back gate electrode.

* * * * *